United States Patent [19]

Maheras et al.

[11] Patent Number: 4,523,851
[45] Date of Patent: Jun. 18, 1985

[54] PRECISION IC ALIGNMENT KEYS AND METHOD

[75] Inventors: George Maheras; Hubert O. Hayworth, both of Fort Collins, Colo.

[73] Assignee: NCR Corporation, Dayton, Ohio

[21] Appl. No.: 407,204

[22] Filed: Aug. 11, 1982

[51] Int. Cl.³ .............................................. G01B 11/00
[52] U.S. Cl. .................................................. 356/399
[58] Field of Search ............... 356/399, 400, 401, 153, 356/363

[56] References Cited

U.S. PATENT DOCUMENTS

| | | | |
|---|---|---|---|
| 3,694,089 | 9/1972 | Rantsch | 356/138 |
| 3,739,247 | 6/1973 | Yamaguchi et al. | 356/400 |
| 3,918,813 | 11/1975 | Rossiter | 356/153 |
| 3,947,126 | 3/1976 | Mendez | 356/399 |
| 4,167,677 | 9/1979 | Suzki | 356/401 |

FOREIGN PATENT DOCUMENTS 1286421  8/1972  United Kingdom.

Primary Examiner—R. A. Rosenberger
Attorney, Agent, or Firm—J. T. Cavender; Casimer K. Salys

[57] ABSTRACT

Various structural patterns of alignment keys particularly suited for aligning masks and wafers during the fabrication of semiconductor devices. Each alignment key includes an orthogonal arrangement of bar-shaped segments. The relative dimensions of the mask and wafer alignment keys ensure a partial overlap and coaxial positioning of the bar-shaped segments when the keys are fully aligned. Precise optical alignment of the mask and wafer keys is evidenced by visually perceived edge diffraction effects. The invention also encompasses a systematic method for aligning representative structural patterns.

6 Claims, 8 Drawing Figures

PRECISION IC ALIGNMENT KEYS AND METHOD

BRIEF SUMMARY

The present invention relates to alignment key patterns having structural attributes which are particularly suited for making rapid and precise optical alignments. More particularly, the invention is directed to various structural patterns and procedures for aligning masks with semiconductor wafers during the manufacture of integrated circuit devices.

In one form of practicing the invention, the alignment key patterns are optically superimposed in an overlapping relationship utilizing conventional alignment equipment. A partial overlap of dimensionally similar alignment key patterns creates an edge diffraction effect. Optical detection of the effect ensures that the mask and wafer patterns are positioned with a relative high degree of precision.

Alignment keys having the structural attributes suitable to overlap and diffract are generally characterized by their orthogonal arrangement of elongated bar-type segments on both the mask and wafer, which segments are constrained so as to slightly overlap at corresponding bar segments when aligned.

The invention also encompasses a method by which the alignment keys of the present invention may be utilized in a systematic process with relative ease, speed and accuracy. In particular, alignment is commenced with rotational orientations followed by translations along a first axis. Alignment is completed by the independent movement of the remaining translational axis. The physical shapes of the keys are conducive to the making of such independent adjustments in each of the three movable axes.

The edge diffraction effect noted hereinbefore creates a visually perceived reduction in the width of bar segments which overlap upon alignment. The diffraction effect is abrupt and highly repetitive, leading to exceptional precision in the alignment of masks and wafers during semiconductor processing.

These and other benefits of the present invention will be understood when considering the drawings and detailed description that follows.

DETAILED DESCRIPTION

The alignment of masks in semiconductor wafers during the fabrication of integrated circuit (IC) devices is a relatively refined art. Though numerous configurations of commercial equipment are available to perform the alignment operation, including both manual and automated configurations, there remains a continuing need for greater precision, repeatability and operator ease in completing the operations. As particular examples of the trend in automated alignment equipment, inquiry is directed to the teachings, in U.S. Pat. Nos. 4,167,677 and 4,251,160.

Though the structural patterns and methods disclosed by way of embodiments hereinafter are described with reference to manual alignments of the mask and wafer, the underlying principles are clearly of sufficient breadth to encompass automated systems. This is particularly true of the method described, recognizing that the method follows a systematic progression of steps and conditions while constraining the number of uncontrolled variables.

Figure 1:
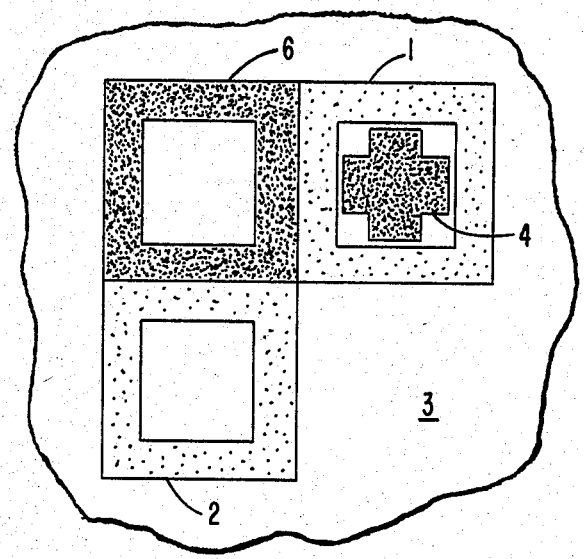
FIG. 1 is a schematic showing a representative set of alignment keys from the prior art.

Attention is now directed to FIG. 1 of the drawing, where there is shown a structural pattern of alignment keys typifying the prior art for manual equipment. In a representative application, square-shaped alignment key patterns 1 and 2 are formed on wafer surface 3. Optical alignment of the mask with the wafer is established when cross-shaped key 4 is centered within square-shaped key 1. As is often the case, the mask which introduces cross-shaped key 4 is also used to add an additional key, e.g. square-shaped key 6, for subsequent levels of process alignment or for alignment of multiple masks. Representative examples of other known patterns include squares, crosses and circular shapes disposed within each other.

Unfortunately, conventional alignment methods evolved from the use of alignment keys with the classic square, cross or circular patterns. The shapes characterizing the prior art patterns allow significant latitude in defining an aligned state and thereby increase the magnitudes of the alignment errors. Comparative magnitudes of alignment error will be described with reference to tabulated test data hereinafter. Furthermore, the prior art patterns were not conducive to establishing a systematic alignment sequence. The lack of a systematic approach is attributable to the absence of pattern characteristics which prescribe or induce a defined sequence of alignment steps. Note that an optical alignment of a mask key to a wafer key involves adjustments in three axes, two of translation and one of rotation. An experienced mask aligner employs personal discretion in selecting the sequence for making the axial adjustments. The effect of such discretion is to make the alignment process a best-effort approach, in which the precision becomes a subjective decision partially influenced by the balancing of work output against apparent accuracy.

The presently disclosed alignment key structural patterns and related alignment process steps overcome the various deficiencies associated with the prior art. The edge diffraction effects significantly improve alignment precision, while the orthogonally overlapping shapes characterizing the alignment keys induce the mask aligner to follow a systematic sequence in which one translational adjustment is always deferred to the very end of the alignment process.

Preferred embodiments of the alignment keys and alignment methods employing the keys are schematically depicted in FIGS. 2A-2D. Beginning with FIG. 2A, it is shown that the embodying alignment keys are comprised of substantially identical "bar" segments oriented in orthogonal pairs on both the wafer and the mask. Briefly moving ahead to FIG. 2D, it is also evident that the positions of the bars on the wafer and those on the mask are displaced so that only portions of the bars overlap when the wafer and mask are fully aligned.

Figure 2A:
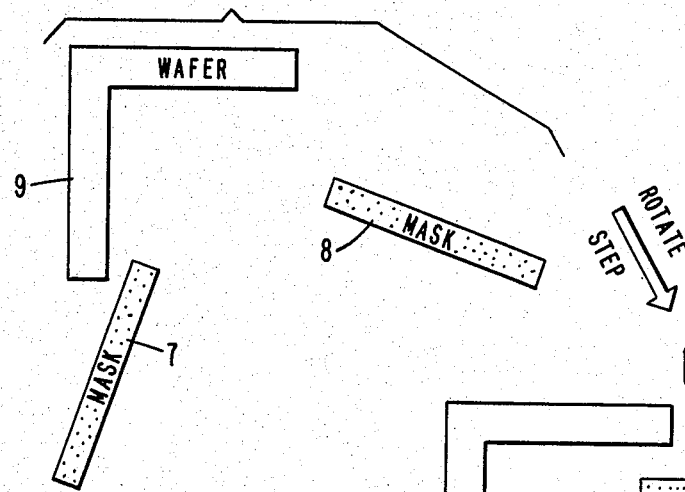
FIGS. 2A-2D are schematic illustrations of embodying alignment keys used according to the new alignment method.

Beginning with FIG. 2A, the mask aligner's objective is to overlap or optically superimpose bars 7 and 8, of the mask key, over the bars 9 of the key on the wafer. The rotational misorientation of the mask and wafer keys has been exaggerated to accentuate the various sources of alignment error.

Figure 2B:
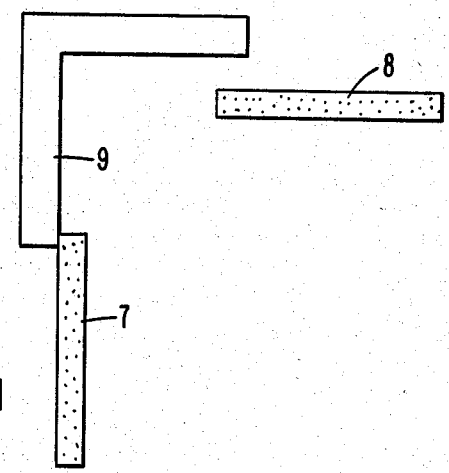
Figure 2C:
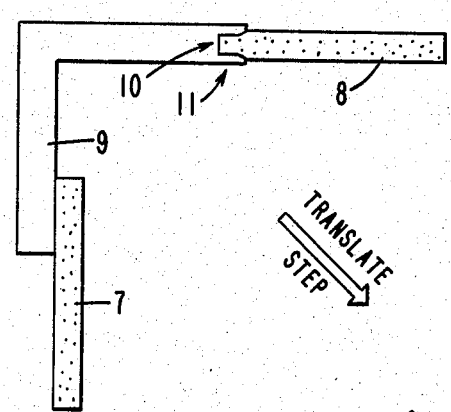
Figure 2D:
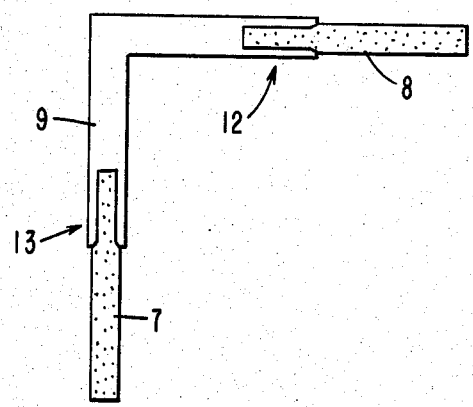

The process aspect of the invention is illustrated by the sequence of alignment steps forming FIGS. 2A–2D. The initial misalignment of the mask and wafer keys is shown in FIG. 2A. After the rotation of the mask with respect to the wafer, the positions generally assume the arrangement in FIG. 2B. Vertical translation, in the context of the drawing sheet, leads to an alignment of the horizontal bar segment of 9 with bar 8, as shown in FIG. 2C. The alignment process is concluded with a horizontal translation of the mask until the vertical bar segment of 9 is aligned with bar 7, as shown in FIG. 2D.

An experienced mask aligner will generally perform the rotational and translational steps, between FIGS. 2B and 2C, together by simultaneously regulating two different axes of motion. Moreover, since the alignment keys are normally not located at the center of rotation, the effects of rotational adjustments on the translational positions further induces the aligner to undertake concurrent adjustments. If the final translational adjustment produces adequate alignment the process is completed. Otherwise, the sequence is repeated.

A number of interesting and valuable features attributable to the embodying alignment keys are presented by the illustrations in FIGS. 2A–2D. These features augment both process efficiency and alignment precision. First, the bar segments now utilize the aligner's natural ability to visually perceive relatively minor misalignments between segments forming a single, elongated projection. In this case, the partial overlap of the bar segments in each of the translational axes allows the nonoverlapping segments to extend the elongated projection and thereby accentuate any misalignment errors. Second, the orthogonal orientation and elongated shape of the bar segments forces the mask aligner to concentrate on only one translational axis, in conjunction with or independent of the rotational axis, during the initial segment of the alignment sequence, leaving the other translational axis for subsequent consideration. Thereby, the aligner is induced to use a systematic alignment process, which focuses attention on selected alignment variables. Third, the pattern reinforces the aligner's confidence in each partial alignment, e.g. the state depicted in FIG. 2C, by using orthogonality to create a perception of complete independence between the translational axes. For instance, the translation of bar 7 into alignment with bar 9, between FIGS. 2C and 2D, appears to have no affect on the previous alignment of bar 8.

Foremost, however, the use of partially overlapping alignment keys introduces a level of alignment precision normally unattainable with conventional key patterns and alignment processes. The improvement is attributable to the presence and utilization of the edge diffraction effect. This effect is visually perceived as generally appears in FIGS. 2C and 2D, where bar segments 7 and 8 on the mask have been reduced in apparent width at the areas overlapping bar 9. See locations 11, 12 and 13. The phenomenon is most pronounced when the bar segments on the mask are slightly narrower than the bar segments on the wafer.

The abrupt nature of this edge diffraction effect also facilitates the detection of minor rotational misalignments. For instance, the perceived narrowing at end 10 of bar 8 in FIG. 2C would cease if the mask were translated in the manner leading to FIG. 2D while rotationally misaligned. Therefore, the accuracy of the rotational alignment is determined by the length of the overlap.

It will no doubt now be recognized that the use of the above-described diffraction effect in the alignment of masks and wafers provides a quantum increase in the potential accuracy when compared to conventional alignment keys. This level of improvement is evidenced by the test data presented in Table I, showing the comparative results of 200 test alignments. One hundred were performed with the alignment keys and method disclosed in the present invention. The remaining hundred utilized conventional patterns and processes. The alignment work was evenly distributed among four experienced mask aligners, and was performed at a substantially equal rate of production.

TABLE I

| Precision | New Keys | Standard Keys |
|---|---|---|
| ≦0.25 microns | 80% | 10% |
| ≦0.50 microns | 95% | 45% |
| ≦0.75 microns | 100% | 85% |
| ≦1.0 microns | 100% | 90% |

In general, Table I shows that the relatively unrefined test patterns and methods of the present invention substantially tripled the alignment precision when compared to standard key configurations. With time, further improvements in the fundamental arrangements and method described herein will no doubt accentuate the improvement to an even greater degree.

Those working in the mask alignment field undoubtedly have already recognized that the symmetry of the embodying alignment keys, the abrupt edge diffraction effects in the areas of overlap, and the systematic approach to the alignment, are uniquely inclined to automation. Though a description of automated alignment equipment utilizing the features of the invention is beyond the scope of the present disclosure, such automated applications remain fully within the contemplated practice of the present invention.

Figure 3:
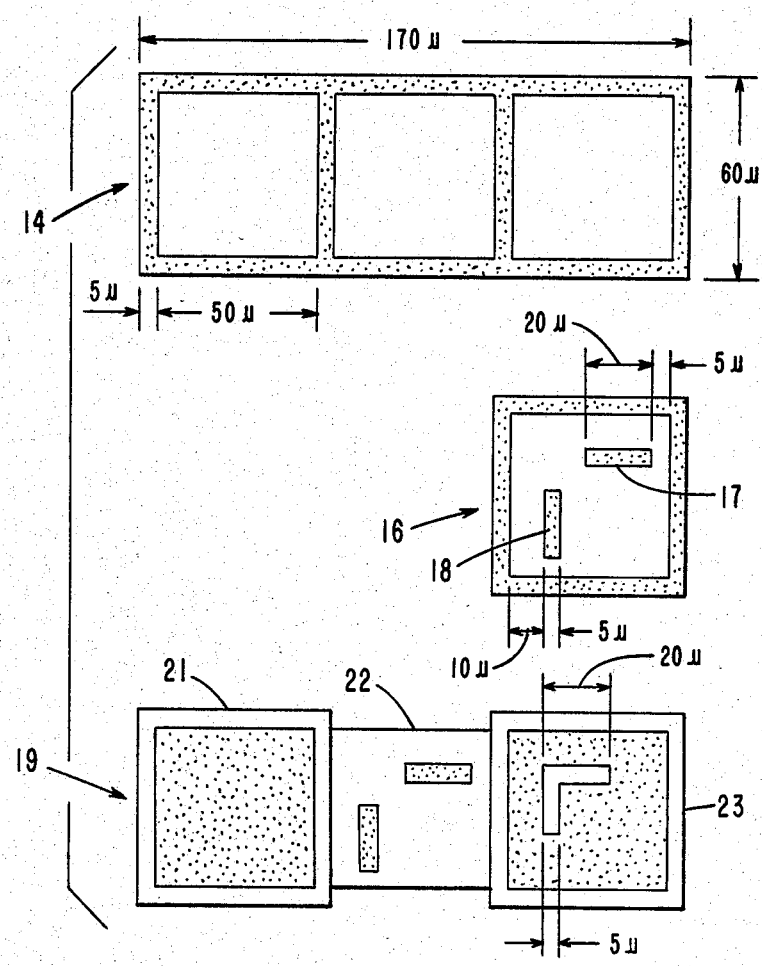
FIG. 3 is a schematic showing various embodiments of the alignment keys.

FIG. 3 depicts a number of illustrative alignment patterns, including not only the alignment keys but various square-shaped targets. The targets are suitable for coarse alignment operations or for the general location of the preferred alignment keys. Pattern 14 shows a grouping of three targets, which by way of example would be suited for the coarse location of pattern 16. Bars 17 and 18 of pattern 17 would thereby become located within one of the targets and available for precise alignment to pattern 16 during succeeding stages of fabrication. The pattern at 19 illustrates a composite alignment pattern as it might appear during an intermediate level of processing on a semiconductor wafer. In the case of pattern 19, target 21 is for general future use, pattern 22 represents an exemplary alignment key without a square-shaped target, and pattern 23 is a target encompassing an alignment key.

The dimensions of the structural patterns in FIG. 3 merely illustrate a group of representative sizes suitable to practice the present invention as described herein. Refinements are clearly anticipated. As with all critical alignment keys, the sizes of the mask patterns must include compensation for etch and resist biases introduced during the actual formation of the patterns on the masks and wafers.

Figure 4A:
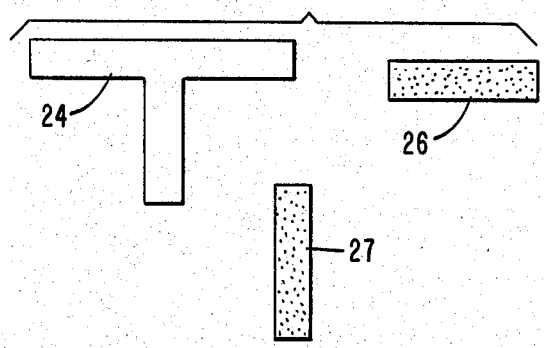
FIG. 4 is a schematic of another alignment key configuration.
Figure 4B:
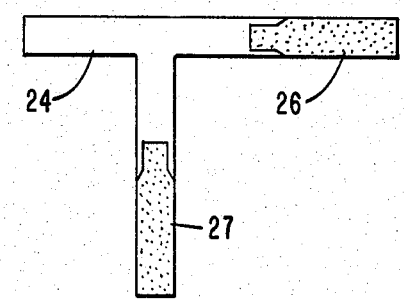

FIG. 4A illustrates another combination of structural patterns which may be suited for use in microscopic alignment applications according to the general practice of this invention. Again, alignment involves the partial overlap of the bars in pattern 24 with those of patterns 26 and 27. The aligned condition is shown in FIG. 4B. The configurations in FIGS. 4A and 4B are distinguishable by virtue of the "T" shape of pattern 24. The leftward projection of the horizontal bar, in the context of the drawing sheet, increases the range in the leftward direction over which the first translational alignment step can be performed.

With the foregoing description at hand, one having the requisite skills in the art no doubt recognizes that the invention is significantly broader than the embodiments specifically illustrate. Therefore, the invention should be recognized as applying to the full scope and spirit of present teachings and their equivalents.

We claim:

1. An alignment key system, comprising:
    a first structural pattern lying in a first plane, characterized by two substantially straight segments that are greater in length than in width and that are substantially orthogonal in relative orientation; and
    a second structural pattern lying in a second plane visually parallel to said first plane, characterized by two substantially straight segments that are greater in length than in width, that are substantially orthogonal in relative orientation, that have a relative position one to another to cause a visually perceived partial overlap with said first structural pattern when said first and second structural patterns are aligned, and that in such an aligned state locates the overlapping regions to be furthest from the intersection defined by linear projections of the orthogonal segments of the first structural pattern.

2. The system recited in claim 1, wherein the widths of said first and said second structural patterns are sufficiently close in dimension to create edge diffraction effects in the partial overlapping regions.

3. The system recited in claim 2, wherein the two substantially straight segments of said first structural pattern extend from a point of intersection, and the two substantially straight segments of said second structural pattern are physical separate but lie on linear projections from said point of intersection.

4. The system recited in claim 3, wherein said first and second structural patterns are microscopic in size, and said first and second planes are parallel when said structural patterns are aligned.

5. A method for aligning two planar patterns of parallel disposition, in which the first pattern has an orthogonal arrangement of bar-shaped segments joined at one end and the second pattern has an orthogonal arrangement of dimensionally similar bar-shaped segments which are not joined, comprising the steps of:
    rotating one pattern until the corresponding bar segments are substantially parallel;
    translating one pattern until an overlap of bar segments is detected by the perception of edge diffraction effects at the overlap of the bar segments; and
    translating one pattern until an overlap of all bar segments is detected by the perception of edge diffraction effects at the overlap of the bar segments.

6. The method recited in claim 5, wherein said rotating step and the first of said translating steps are performed concurrently.

* * * * *